United States Patent [19]

Benson et al.

[11] 3,747,198

[45] July 24, 1973

[54] TAILLESS WEDGE BONDING OF GOLD WIRE TO PALLADIUM-SILVER CERMETS

[75] Inventors: Harold L. Benson; Dwight W. Callaway, both of Kokomo, Ind.

[73] Assignee: General Electric Corporation, Detroit, Mich.

[22] Filed: Aug. 19, 1971

[21] Appl. No.: 173,020

[52] U.S. Cl. .................. 29/471.1, 29/481, 29/497.5, 29/504, 228/1, 228/13

[51] Int. Cl. .............................................. B23k 31/02

[58] Field of Search ........................ 29/470.1, 471.1, 29/471.3, 480, 481, 497.5, 504; 228/1, 13

[56] References Cited

UNITED STATES PATENTS

| | | | |
|---|---|---|---|
| 3,397,451 | 8/1968 | Avedissian et al. | 29/471.1 X |
| 3,400,448 | 9/1968 | Helda et al. | 29/471.1 |
| 3,444,612 | 5/1969 | Pennings | 29/471.1 |
| 3,627,192 | 12/1971 | Killingsworth | 228/1 X |
| 3,643,321 | 2/1972 | Field et al. | 29/471.1 X |
| 3,648,354 | 3/1972 | Mashino et al. | 29/471.1 X |

OTHER PUBLICATIONS

IBM Technical Disclosure Bulletin, Vol. 8, No. 12, May 1968, page 1892

*Primary Examiner*—Richard Bernard Lazarus
*Attorney*—William S. Pettigrew and Robert J. Wallace

[57] ABSTRACT

A technique for making tailless wire bonds directly to palladium-silver cermet surfaces on ceramic substrates. Hard-as-drawn substantially pure gold wire is wedge bonded to the palladium-silver surface with a heated ultrasonic bonding wedge. Strong bonds are so reliably produced that automatic tail pulling is practical even under high volume commercial production conditions.

4 Claims, 1 Drawing Figure

PATENTED JUL 24 1973 3,747,198
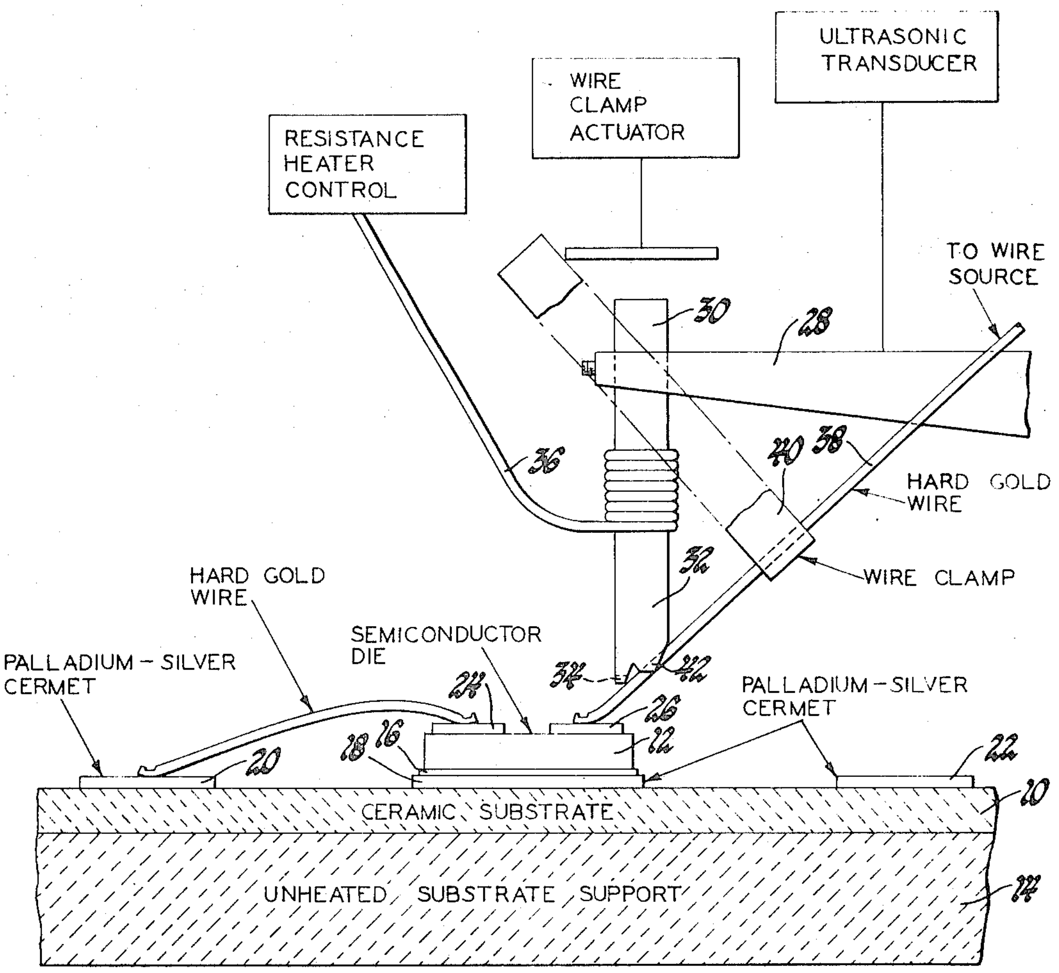
INVENTORS.
Harold L. Benson &
BY Dwight W. Callaway
Robert J. Wallace
ATTORNEY

TAILLESS WEDGE BONDING OF GOLD WIRE TO PALLADIUM-SILVER CERMETS

BACKGROUND OF THE INVENTION

This invention relates to the ultrasonic bonding of filamentary wire leads in semiconductor devices. More specifically, it involves a method for rapidly and consistently making reliable tailless filamentary wire bonds directly to palladium-silver cermet surfaces.

Filamentary gold or aluminum wire leads are frequently used to make electrical interconnections in miniature semiconductor devices. The wire filaments are usually attached by pressure bonding or ultrasonic bonding. Gold wire is generally bonded by thermocompression or ultrasonic ball bonding, such as shown in U.S. Pat. No. 3,430,835, Groble et al. Aluminum wire is generally bonded by a combination of pressure and ultrasonic energy, such as described in U.S. Pat. No. 3,459,355, Metzger, Jr. or U.S. Pat. No. 3,347,442, Reber. This latter technique is commonly referred to as wedge bonding.

Both types of bonding have been extensively developed to increase bond reliability and reduce bonding costs. Considerable emphasis has been made on bonding techniques which do not produce any "tail," that is excess unbonded wire, on the wire interconnections.

It is desirable for many reasons to be able to remove the tail by pulling, or tearing, it away directly at the bond. It is objectionable to do this on the aluminized surface of the semiconductor die. Hence, if done at all, it has to be done at the other end of the connector wire, as for example on the palladium-silver cermet contact pad of a supporting ceramic substrate. Unfortunately, the prior techniques inherently did not permit tail pulling from palladium-silver cermet surfaces. The wire needed to get good bonding was too soft for satisfactory tail pulling, bond strengths were to low, or the variable affecting bond strength and reliability were too critical for consistent results under commercial production conditions. Hence, automatic tailing by pulling from palladium-silver cermet surfaces was not practical.

Palladium-silver cermets are generally used for thick film conductor patterns that are silk screened onto ceramic substrates. The palladium-silver cermet has a "coral-like" surface structure, having protrusions which are somewhat nodular. This structure is deformable and pressure tends to collapse it. The collapse produces a smoother surface, which in turn requires increased amounts of energy for subsequent deformation and satisfactory wire bonding. Also, it is important to note that these surface characteristics vary considerably from lot to lot even under rigid process control, apparently due to ink composition differences, screen variations, and firing fluctuations.

Ultrasonic ball bonding was initially used in attempts to develop a rapid production method for bonding gold wire to palladium-silver cermets. Soft gold wire is needed in this type of bonding for good bond strength. However, no capillary configuration was found which yielded both a good ball bond and the ability to automatically satisfactorily pull the tail on the second bond under production conditions. Even tool configurations having an elongated groove on the capillary tip did not assure clean tailing of the second bond on a high volume production basis. A significantly large flatted area was required to cause metal flow into the palladium silver. This required high tool pressures, which in turn caused higher tool wear. Moreover, at such high pressure severe wire deformation is incurred at the heel of the bond. This produces stress risers that reduce bond reliability. Modifications of the grooved tip can enhance reliability of the bond. However, no compromise was achieved which assured a good flatted area for high bond reliability and suitable deformation for reproducible tailing on a high volume production basis.

Ultrasonic wedge bonding of hard aluminum wire is regularly used in high volume production because it can be used to automatically and consistently form tailless bonds by pulling on metal connectors or gold cermet surfaces. However, comparably high bond reliability is not achieved when using this technique to bond aluminum wire directly to palladium-silver cermet surfaces. The high pressures and high energies required in bonding aluminum directly to palladium-silver cermets cause work hardening in the flatted areas, which tear and crack the wire. The required pressure could be decreased by not using the usual groove in the wedge tip but without the groove severe deformation is caused at the heel of the first bond, making it highly unreliable and subject to wire fracture. This is further complicated by a number of other variables, including tool wear, to make aluminum ultrasonic bonding to palladium-silver surfaces extremely difficult to control in high volume production. Thus, bond variations can be extensive, with large differences in work hardening from bond to bond.

Accordingly, as a compromise a special wire bonding pad, such as a gold cermet area, must be provided on the palladium-silver cermet surface to attain satisfactory results under regular production conditions. This involves extra process steps, extra cost and an extra interface to affect yields and reliability.

We have found a technique by which hard gold wire can be bonded directly to palladium-silver cermets at the usual low pressures and high production rates for bonding aluminum wire to aluminum or gold contact pads. With the lower bonding pressures, variations in palladium-silver cermet characteristics are not as critical and tool wear is reduced. Hence, extremely strong bonds can be consistently obtained quite readily, even under commercial production conditions. With such bond strengths and wire hardness, automatic tail removal by pulling is achieved on palladium-silver cermet surfaces.

OBJECTS AND SUMMARY OF THE INVENTION

It is, therefore, an object of this invention to provide an improved means for reliably bonding filamentary wires directly to palladium-silver cermet surfaces under commercial production conditions. It is also an object of this invention to provide a rapid and economical method for reliably and taillessly bonding filamentary leads to palladium-silver cermet silver surfaces.

The objects of this invention are achieved by using a hard-as-drawn substantially pure gold wire as the filamentary lead and bonding it directly to the palladium-silver cermet surface with an ultrasonic wedge bonder having a working tip which is heated to a temperature of about 150° – 225° C. The working tip of the ultrasonic wedge bonder has an elongated groove for bonding and conventional aluminum wire ultrasonic bonding pressures are employed.

BRIEF DESCRIPTION OF THE DRAWING

Other objects, features and advantages of the invention will become more fully apparent from the following description of preferred embodiments thereof and from the drawing which shows an apparatus for forming hard-as-drawn gold wire interconnections between contact pads on a semiconductor die and thick film palladium-silver cermet contact pads on a supporting ceramic substrate.

DESCRIPTION OF THE PREFERRED EMBODIMENTS

In practicing this invention a ceramic substrate 10 of alumina or the like having a semiconductor die 12 thereon is placed on an unheated horizontally movable support 14. The semiconductor die 12 is attached at 16 to a thick film palladium-silver cermet contact pad 18 on the substrate 10. Die 12 is shown as a silicon transistor wafer but it could be a monolithic integrated circuit wafer. Additional thick film palladium-silver cermet contact pads 20 and 22 on the substrate 10 are provided as contact pads for making filamentary wire interconnections with evaporated aluminum contact pads 24 and 26, respectively, on the semiconductor die 12. The cermet contact pads are formed in the usual manner, as by silk screening a paste onto the substrate 10 and then firing the thus coated substrate.

A projecting arm 28 extending from an ultrasonic transducer supports a bonding wedge 30 having a working tip 32 with an elongated groove 34 thereon. Groove 34 is elongated to insure improved bond strength. Groove length is approximately three times the diameter of the wire being used. For bonding a gold wire 1½ mil in diameter we prefer that groove 34 be approximately 4½ mils long, about 1.1 – 1.3 mils wide and about 0.5 – 0.7 mils deep with a generally circular transverse cross section having a radius of curvature of about 0.7 mils.

A resistance heating coil 36 surrounds the working tip 32. The heating coil 36 is connected to a constant current source to control the temperature of the working tip. A hard-as-drawn 1.5 mil diameter gold wire 38 extends from a wire spool (not shown) through a wire clamp 40 to a position beneath the working tip 32. Wire clamp 40 is actuated to grip gold wire 38 and move it axially either toward or away from the bonding tip, as desired. Means are provided in the ultrasonic transducer to move arm 28 vertically in and out of engagement with contact pads on the ceramic substrate and the semiconductor die. Tip 32 also has a wire guide means 42 to facilitate seating wire 38 in groove 34.

The gold wire must be hard in order to permit satisfactory tail pulling and yet not so hard as to deleteriously affect bonding. We use gold wire of 99.99 percent purity having a minimum tensile strength of 33,000 psi and an elongation of only about 1.5 – 3.0 percent according to ASTM Methods F219. While we prefer to use 1.5 mil diameter wire of 35 – 45 grams breaking strength, 1 – 2 mil diameter wire can be employed.

To practice this invention, a free end of the gold wire 38 extending from the spool is moved by clamp 40 to a position under the bonding tip and seated in groove 34. The bonding tip is preferably maintained at a temperature of about 150° – 200° C. Lower temperatures are to be avoided. Higher temperatures, up to 250° C., can be used if they do not adversely affect the tensile strength and elongation of the wire as it is being bonded. The ceramic substrate is moved under the bonding tip to position pad 26 under it. One can register the bonding tip to position pad 26 under it. One can register the bonding tip and pad by horizontally moving either the tip or the substrate. We prefer to move the substrate. The hot bonding tip is then pressed down onto the pad, such as die pad 26, with a force of approximately 40 – 45 grams while it is ultrasonically vibrated in the usual manner. Bonding pressures typical to aluminum wire bonding to aluminum pads are used, as for example of the order of 4,500 – 5,000 pounds per square inch. For hard gold wire diameters of approximately 1 mil a force of only 25 – 30 grams or about 2,000 – 2,500 pounds per square inch would be needed.

After making the first bond, the wedge is raised with the wire clamp open, and the substrate moved laterally to register the palladium-silver cermet pad 22 beneath the bonding tip. During this movement the gold wire 38 is free to unroll from the source spool through the clamp 40, wire guide 42 and under groove 34 in the bonding tip. At the end of this movement the wire 38 is at least partially seated in groove 34 so that downward movement of the bonding tip will complete the seating. The hot bonding tip is then moved downwardly again with a force of approximately 40 – 45 grams or about 3,500 – 4,000 pounds per square inch while ultrasonically vibrated to bond the gold wire to the palladium-silver cermet pad. The wire clamp is then actuated to grip the wire and pull it away from the bonding wedge. This tears the wire extending from the spool away from the palladium-silver cermet pad 22 right at the bond, simultaneously providing a tailless bond and a new free end on the spool. The bonding tip is then raised and the wire clamp shuttles this new free end underneath the bonding tip to form the next filamentary wire interconnection.

We claim:

1. A rapid and economical method for reliably and consistently taillessly bonding filamentary wires directly to a palladium-silver cermet surface under commercial production conditions, said method comprising the steps of placing a portion of a length of hard-as-drawn substantially pure gold wire over a palladium-silver cermet surface, said gold wire being about 1 – 2 mils in diameter and having a tensile strength of at least about 33,000 psi and an elongation of only about 1.5 – 3 percent before breaking, seating said wire portion in an elongated groove on the working tip of a heated ultrasonic bonding wedge, maintaining said working tip at a temperature of about 150° – 225° C., pressing said wire portion against said palladium-silver surface with said heated working tip with a pressure of about 2,000–5,000 pounds per square inch, concurrently ultrasonically vibrating the wedge to securely bond said wire portion to said surface without significant work hardening of the wire at the bond, pulling an unbonded portion of said wire length to tear it from said bonded portion without deleteriously affecting the bond, and removing said wedge from said bonded wire portion.

2. A rapid and economical method for reliably and consistently taillessly bonding filamentary wires directly to a palladium-silver cermet surface, said method comprising the steps of placing a portion of a length of hard-as-drawn substantially pure gold wire over a palladium-silver cermet surface, said gold wire being about 1.5 mils in diameter and having a breaking strength of 35 – 45 grams with an elongation before breaking of 1.5 – 3 percent, seating said wire portion in an elongated groove in the working tip of an ultrasonic bonding wedge, said groove being about 4.5 mils long, about 1.1 – 1.3 mils wide and about 0.5 – 0.7 mils deep with a generally circular transverse cross section having a radius of curvature of about 0.7 mils, maintaining said working tip at a temperature of about 150° – 200° C., pressing said wire portion against said palladium-silver surface with said heated working tip with a force of about 40 – 45 grams or about 3,500 – 4,000 pounds per square inch, concurrently ultrasonically vibrating the wedge to securely bond said wire portion to said surface without significantly work hardening the wire adjacent said bonded portion, automatically pulling an unbonded portion of said wire length to tear it free of said bonded portion, and removing said wedge from said bonded portion.

3. A rapid and economical method for reliably and consistently making a filamentary wire interconnection between a contact pad on a semiconductor die and a thick film palladium-silver cermet contact pad on a ceramic substrate supporting said die, said method comprising the steps of maintaining the working tip of an ultrasonic bonding wedge at a temperature of about 150° – 200° C., seating an end of a hard-as-drawn substantially pure gold wire in an elongated groove in said working tip, said end extending from a source spool, said gold wire being about 1 – 2 mils in diameter and having a tensile strength of at least about 33,000 psi and an elongation of only about 1.5 – 3 percent before breaking, pressing said wire end against an aluminized contact pad on a semiconductor die with said heated tip with a pressure of about 2,000–5,000 pounds per square inch, concurrently ultrasonically vibrating the wedge to securely bond said wire end to said pad without significantly work hardening wire at the bond, removing said wedge from said bonded end, leading said wire over to and registering a portion of it with a palladium-silver cermet contact pad on a ceramic support for said die, seating said wire portion in said groove in said heated tip, pressing said wire portion against said palladium-silver cermet contact pad with said tip to similarly bond said wire portion to said cermet contact pad, automatically pulling the wire extending from said bonded portion to said spool to tear it from said bonded portion without deleteriously affecting the bond and to form a free end on said spool, removing said wedge from said bonded portion, and positioning said spool free end under said working tip.

4. A rapid and economical method for reliably and consistently making a filamentary wire interconnection between a contact pad on a semiconductor die and a thick film palladium-silver cermet contact pad on a ceramic substrate supporting said die, said method comprising the steps of maintaining the working tip of an ultrasonic bonding wedge at a temperature of about 150° – 200° C., seating an end of a hard-as-drawn substantially pure gold wire in an elongated groove in said working tip, said end extending from a source spool, said gold wire being about 1½ mils in diameter and having a tensile strength of at least about 33,000 psi and an elongation of only about 1.5 – 3 percent before breaking, said groove in said tip being about 4.5 mils long, about 1.1 – 1.3 mils wide and about 0.5 – 0.7 mils deep with a circular transverse cross section having a radius of curvature of about 0.7 mils, pressing said wire end against an aluminized contact pad on a semiconductor die with said heated tip under a force of about 40 – 45 grams or about 3,500–4,000 pounds per square inch, concurrently ultrasonically vibrating the wedge to securely bond said wire end to said pad without significantly work hardening wire at the bond, removing said wedge from said bonded end, leading said wire over to and registering a portion of it with a palladium-silver cermet contact pad on a ceramic support for said die, seating said wire portion in said groove in said heated tip, pressing said wire portion against said palladium-silver cermet contact pad with said tip to similarly bond said wire portion to said cermet contact pad, automatically pulling the wire extending from said bonded portion to said spool to tear it from said bonded portion without deleteriously affecting the bond and to form a free end on said spool, removing said wedge from said bonded portion, and positioning said spool free end under said working tip.

* * * * *